(12) United States Patent
Adkisson et al.

(10) Patent No.: US 6,472,258 B1
(45) Date of Patent: Oct. 29, 2002

(54) DOUBLE GATE TRENCH TRANSISTOR

(75) Inventors: James W. Adkisson, Jericho, VT (US); Paul D. Agnello, Wappingers Falls, NY (US); Arne W. Ballantine, Round Lake, NY (US); Rama Divakaruni, Somers, NY (US); Erin C. Jones, Tuckahoe, NY (US); Jed H. Rankin, S. Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 09/711,725

(22) Filed: Nov. 13, 2000

(51) Int. Cl.[7] .................. H01L 21/30; H01L 21/336
(52) U.S. Cl. .............. 438/192; 438/157; 438/256; 257/329; 257/347
(58) Field of Search ................. 438/157, 192, 438/256; 257/347, 329

(56) References Cited

U.S. PATENT DOCUMENTS

| | | |
|---|---|---|
| 4,048,646 A | 9/1977 | Ogawa et al. |
| 4,622,569 A | 11/1986 | Lade et al. |
| 4,701,423 A | 10/1987 | Szluk |
| 4,847,212 A | 7/1989 | Balzan et al. |
| 4,849,376 A | 7/1989 | Balzan et al. |
| 4,965,218 A | 10/1990 | Geissberger et al. |
| 5,583,368 A | 12/1996 | Kenney |
| 5,773,331 A | 6/1998 | Solomon et al. |
| 6,335,214 B1 * | 1/2002 | Fung ..................... 438/30 |
| 6,350,635 B1 * | 2/2002 | Noble et al. ............. 438/156 |

* cited by examiner

Primary Examiner—Tom Thomas
Assistant Examiner—Thomas Magee
(74) Attorney, Agent, or Firm—Whitham, Curtis & Christofferson, P.C.; Mark F. Chadurjian

(57) ABSTRACT

A field effect transistor is formed with a sub-lithographic conduction channel and a dual gate which is formed by a simple process by starting with a silicon-on-insulator wafer, allowing most etching processes to use the buried oxide as an etch stop. Low resistivity of the gate, source and drain is achieved by silicide sidewalls or liners while low gate to junction capacitance is achieved by recessing the silicide and polysilicon dual gate structure from the source and drain region edges.

9 Claims, 6 Drawing Sheets

(SECTION AA')

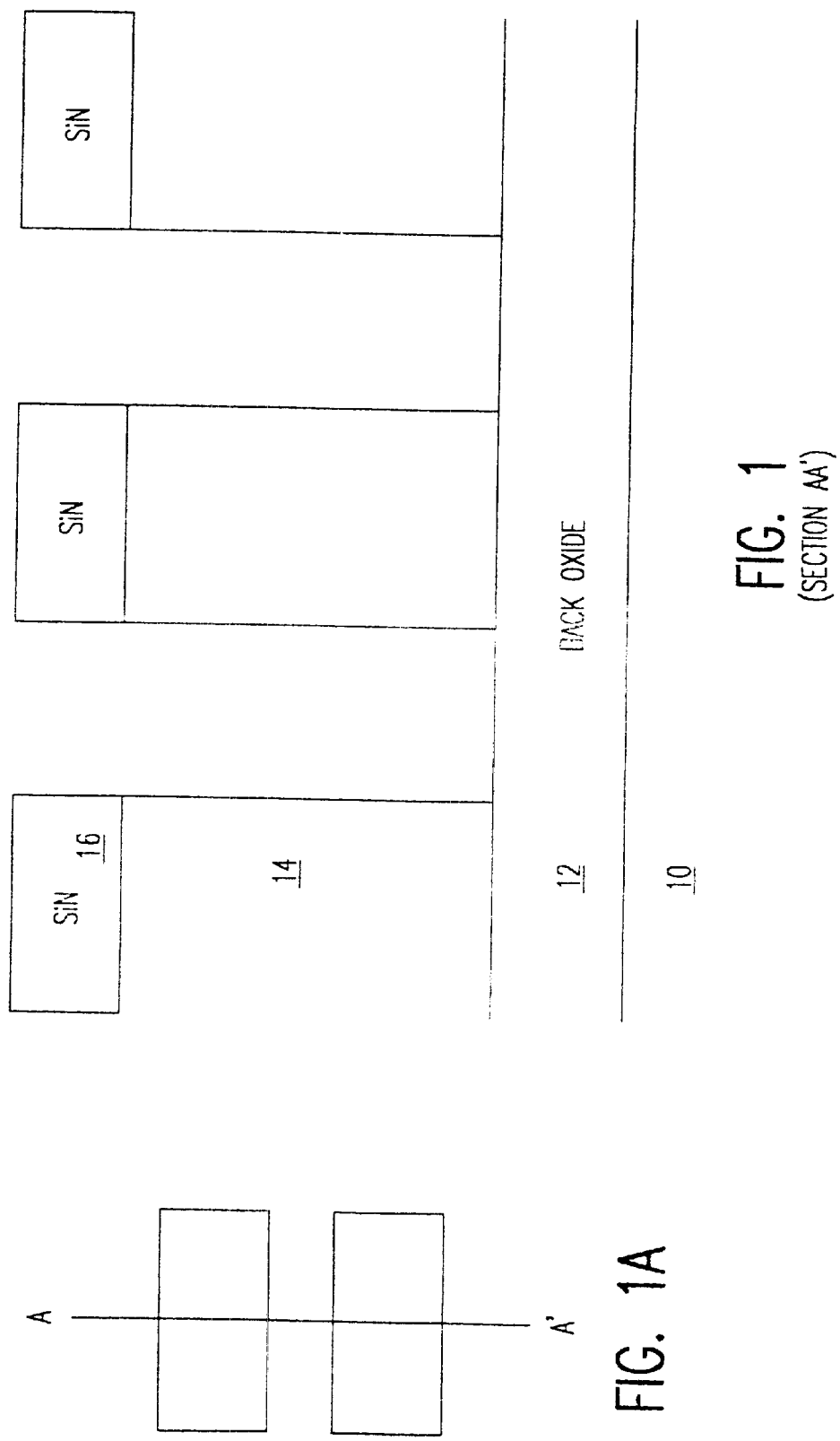

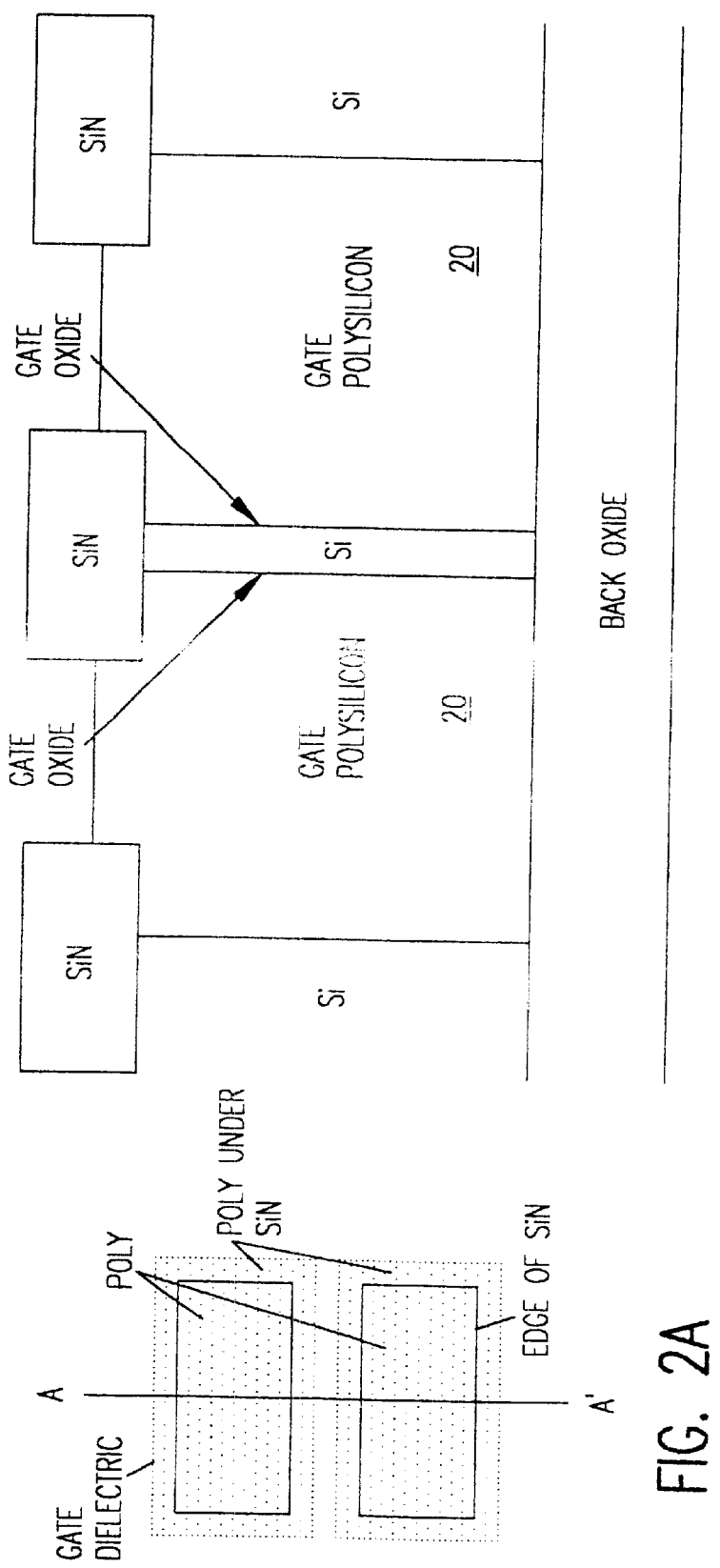

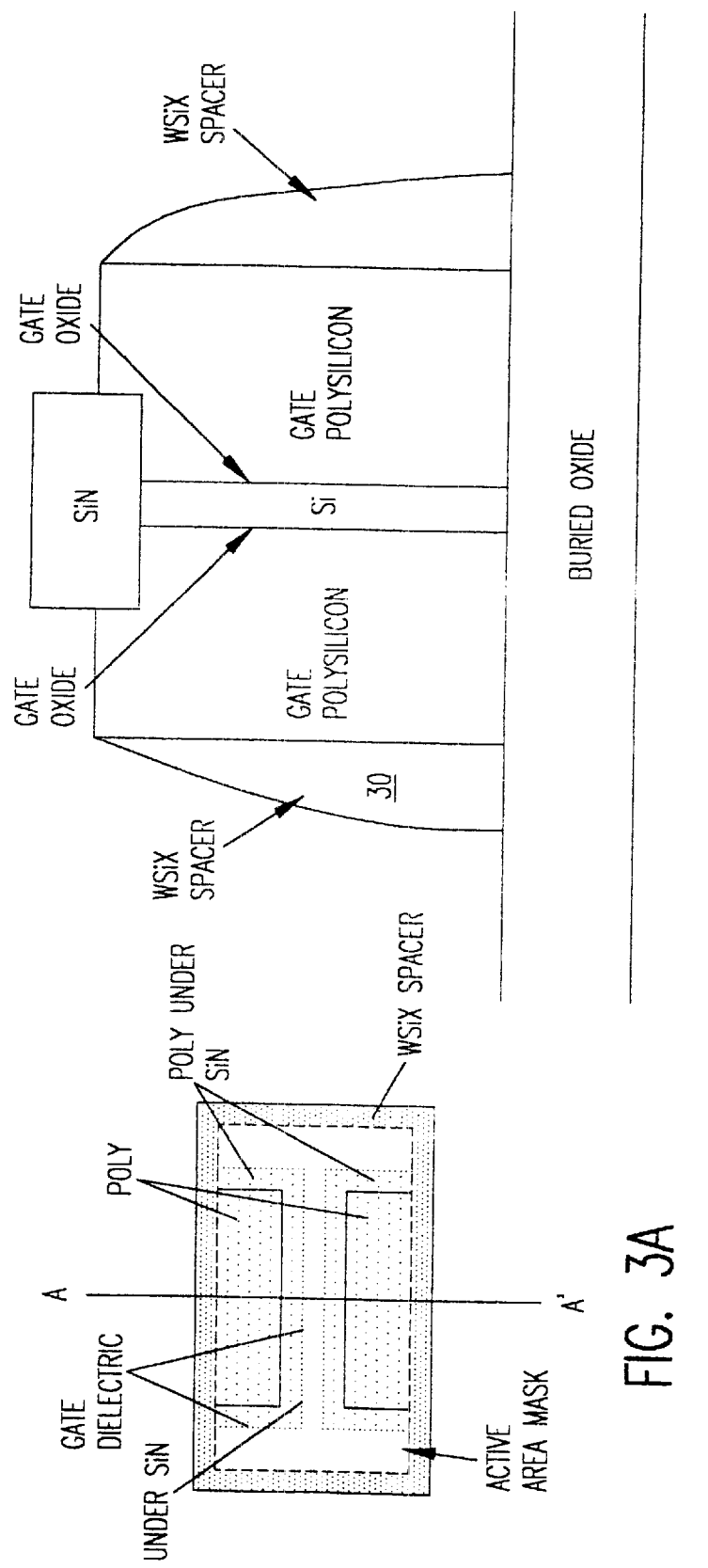

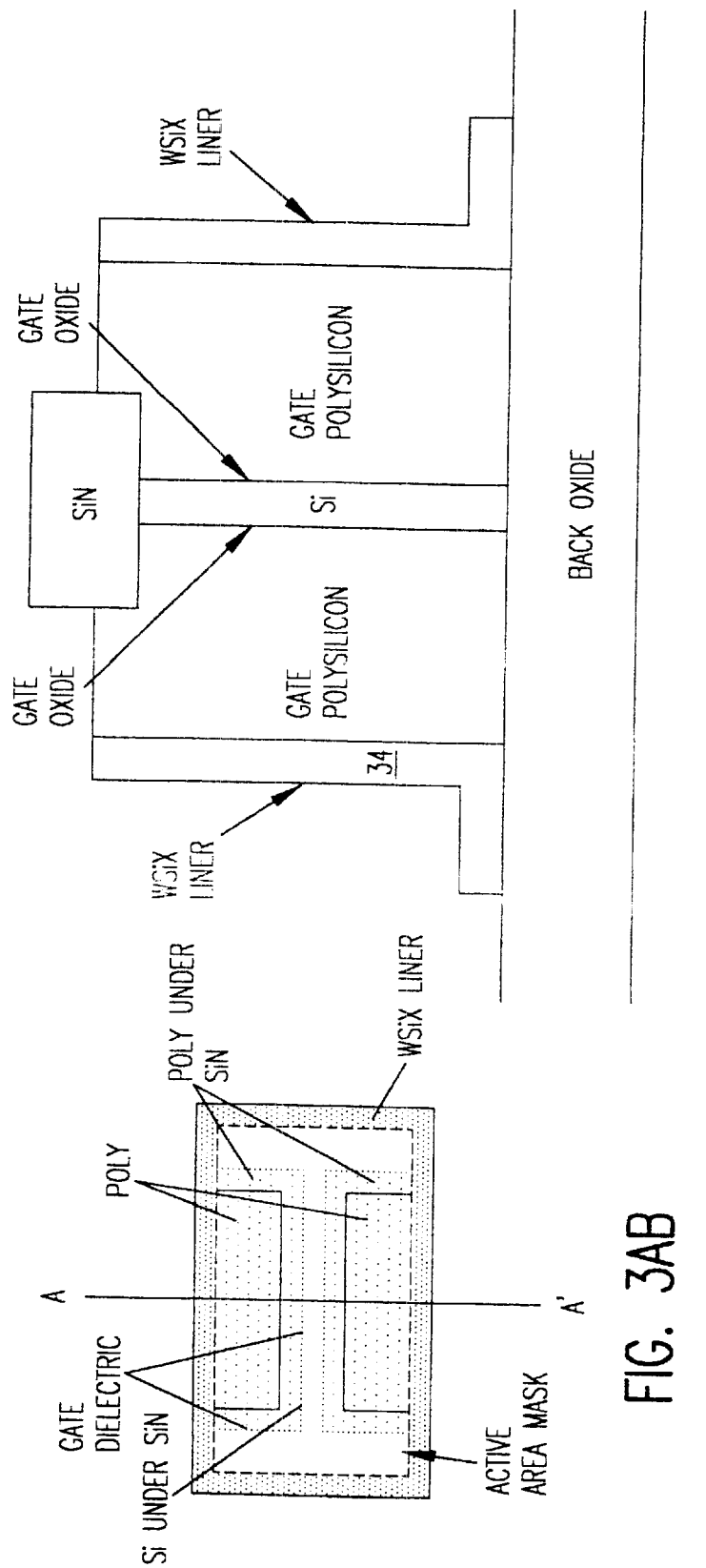

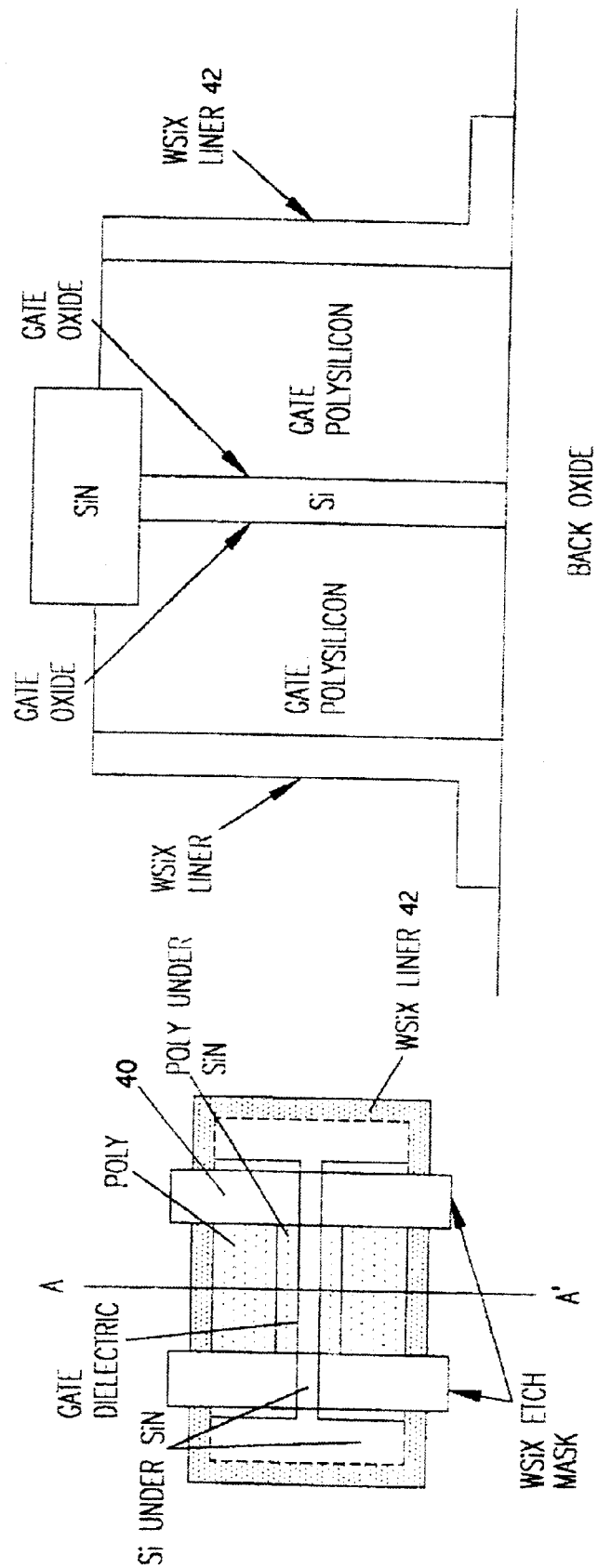

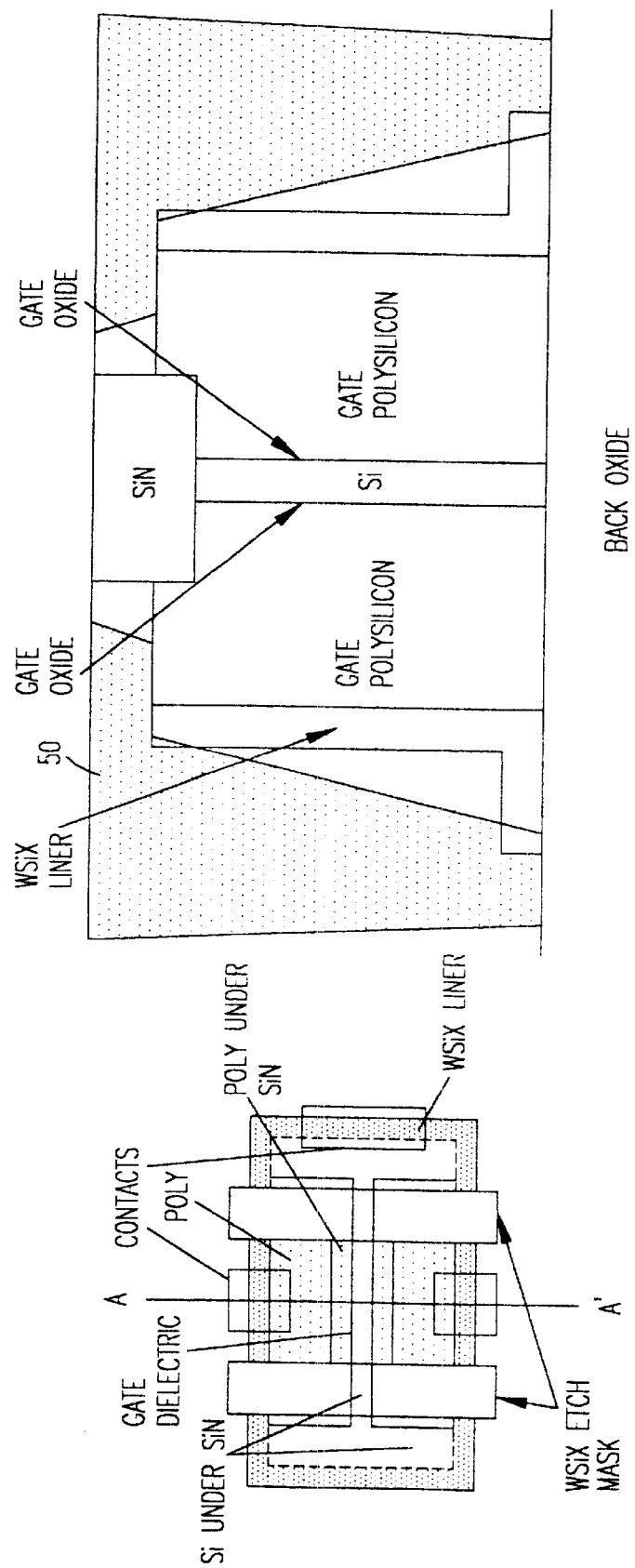

US 6,472,258 B1

DOUBLE GATE TRENCH TRANSISTOR

BACKGROUND OF THE INVENTION

1. Field of the Invention

The present invention generally relates to structures and manufacturing methods for integrated circuits including field effect transistors (FETs) and, more particularly, to high performance FETs suitable for integrated circuits formed at high integration density.

2. Description of the Prior Art

It has been recognized for some years that increased integration density in integrated circuits provides not only improvements in performance and functionality but manufacturing economy, as well. Reduced device sizes and increased numbers of devices on a single chip of a given size have driven designs operating at reduced voltages.

Specifically, one effect of reducing channel or gate length below 50 nanometers is the difficulty in turning off the transistor even in the high dose halo implant. Power dissipation is thus increased since the transistors, in effect, cannot be fully turned off.

It is known to place gates on opposing sides of a channel of an FET which results in substantial improvements in FET performance (confirmed by theoretical and experimental studies). This is possible using gate structures which partially or fully surround the conduction channel. However, these same studies have demonstrated a requirement for an extremely thin diffusion region since, for short gate lengths of interest, the gate length must be maintained about 2–4 times the diffusion thickness. That is, for gate lengths of 20–100 nanometers, the diffusion thickness forming the channel must be held to 5–50 nanometers. Several proposals have been advanced for developing such a thin silicon region.

Another complication with the placement of gates of on opposite sides of the is that many known fabrication processes provide a gate structure which wraps around the conduction channel in a single body. Therefore the entire gate can only be driven to a single voltage even though it is desirable in some circumstances to place different voltages on opposite sides of the conduction channel. Conversely true dual-gate transistor designs that have separated gate electrodes generally precent severe difficulties in forming connections to the separated gate electrodes.

Recently, dual gate devices have been proposed which appear promising at gate dimensions below 70 nm. The performance of these devices is optimal if the two gates are self-aligned, satisfy the silicon thickness to gate dimension ratio outlined in the previous paragraph and specifically do not suffer from increased gate to junction capacitance. Additionally, it is important to have reduced source to drain resistance.

Further, the manufacture of transistors having conduction channels of sub-lithographic dimensions has been complicated and manufacturing processes have generally been complex, costly and having narrow process windows and correspondingly low yield. Not only are the conduction channel dimensions very critical to the performance of the transistor but the conduction channel generally must also be monocrystalline in order to have acceptable and reasonably uniform electrical characteristics.

SUMMARY OF THE INVENTION

It is therefore an object of the present invention to provide a self-aligned dual gate field effect transistor with a channel region which is sub-lithographic in dimensions without increased source-drain resistance and with reduced gate-junction capacitance and allowing independent control of both gates.

In order to accomplish these and other objects of the invention, a field effect transistor is provided comprising a conduction channel of sub-lithographic width, source and drain regions having silicide sidewalls on a surface thereof, and polysilicon gate regions on opposing sides of the conduction channel, the polysilicon having silicide sidewalls formed thereon and recessed from said source and drain regions.

In accordance with another aspect of the invention, a method of forming a field effect transistor is provided including steps of depositing regions of pad nitride on a silicon layer, etching the silicon layer to undercut the pad nitride to form a conduction channel between a source region and a drain region, depositing polysilicon where the silicon has been etched, etching through the polysilicon, depositing silicide on remaining polysilicon and silicon, and removing the silicide and polysilicon from sides of the conduction channel near the source and drain regions.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a cross-sectional view of an initial stage of manufacture of a field effect transistor in accordance with the invention, FIGS. 2, 3, and 4 are cross-sectional views of intermediate stages of fabrication of a transistor in accordance with the invention, FIG. 3B illustrates results of a process which is an alternative to that of FIG. 3, and FIG. 5 is a cross-sectional view of a substantially completed transistor in accordance with the invention, and FIGS. 1A, 2A, 3A, 3AB, 4A and 5A are plan views of the transistor showing the positioning on masks and some features of the transistor which respectively correspond to FIGS. 1, 2, 3, 3B, 4 and 5.

DETAILED DESCRIPTION OF A PREFERRED EMBODIMENT OF THE INVENTION

Referring now to the drawings, and more particularly to FIG. 1, there is shown, in cross sectional view, an initial stage in fabrication of a transistor in accordance with the invention. It should be understood that the cross-sectional views of all Figure are then in a direction orthogonal to the direction of the conduction channel and current flow as shown in partial plan views in correspondingly numbered Figures. Therefore, the source and drain regions are in front of or behind the plane of the page in the cross-sectional views.

It should also be noted that the preferred form of the invention is fabricated on a silicon-on-insulator (SOI) wafer. Such a wafer has a well-regulated thickness of very high-quality monocrystalline silicon which is advantageous for simplicity and economy of processing to fabricate transistors in accordance with the invention. Accordingly, the invention will be disclosed in connection with SOI technology. However, it should be understood that the invention can be made starting with other types of wafers or even wafers of other materials (e.g. Germanium and Group III–V alloys)

and the like as will be apparent to those skilled in the art in view of the following description.

The SOI wafer, as described above will generally include a thick so-called handling wafer or substrate 10 covered by a buried oxide (BOX) 12. Monocrystalline semiconductor layer 14, in turn, covers the buried oxide 12. Doping levels are relatively low in the preferred embodiment of this device, with the requirement that the channel be fully depleted. Typical doping levels are preferably in the $10^{15}/\text{cm}^3$ to $10^{17}/\text{cm}^3$ range with the high $10^{16}/\text{cm}^3$ range being preferred. The process of the present invention begins by forming a layer of pad nitride of about 100 nm thickness and a pad oxide of about 3–10 nm thickness over the silicon and patterning the nitride using a patterned resist 18. The silicon height will determine device width and is preferably in the range of 50–200 nm. Many suitable resists and lithographic techniques for patterning them are familiar to those skilled in the art and specifics thereof are unimportant to the practice of the invention.

The pad nitride film 16 is then opened and the silicon is etched to the buried oxide. Either the resist may be used as an etching mask or the pad nitride (with or without a thin oxide) could be used as a hard mask. Basically, the pad nitride film 16 is then opened and the silicon is etched to the buried oxide by known methods. Two openings in the pad nitride are required to form a single transistor. However, with appropriate opening widths, adjacent transistors could potentially be formed at each nitride stripe or island in the patterned pad nitride.

Then, as shown in FIG. 2, the narrow conduction channels are formed by further etching the silicon to undercut the nitride with a wet etch (e.g. $NH_4OH$ based) or a chemical downstream isotropic etch (CDE) which is selective between the silicon and the BOX to achieve the desired channel width. The channel height is preferably determined by the full thickness of monocrystalline layer 16. The gate dielectric is then grown or deposited to an oxide equivalent thickness of 1–5 nm, with a thickness of 1–2 nm being preferred Silicon dioxide, silicon nitride or higher-k could all be used. The gate material 20 is then deposited, polished and recessed below the nitride surface, as shown. Note that polysilicon is illustrated and may be preferred because of the ease of processing but alternate layers including SiGe alloys or metal layers could be used. In the polishing process, the nitride serves as a polish stop and the gate material is recessed using an isotropic etch. The polysilicon is recessed with a preferably anisotropic etch selective to the pad nitride.

A first alternative in the preferred process is illustrated in FIG. 3 and a second alternative process is illustrated in FIG. 3B. These alternative processes will now be described in turn. Both alternatives produce the overall effect of establishing the active area of the transistor and forming silicide sidewalls, as shown in FIGS. 3 or 3B, although different sidewall contact layer profiles result. In the embodiment of FIG. 3B, a shape in a form referred to as a liner must be modified as will be discussed in connection with FIG. 4. This preferred liner shape results from the slightly more complex process of FIG. 3B.

Referring now to FIG. 3, in the first alternative embodiment of the invention a disposable hard mask of, for example borosilicate glass (BSG), arsenic doped glass (ASG), other doped glass or ozone TEOS is deposited and the active area patterned as shown in FIG. 3A. This active area is generally rectangular with the etched silicon forming an "H" or "I" shaped pattern within it. The ends form the source and drain of the transistor and the central regions of each are joined by a silicon conduction channel. The polysilicon outside the active area is etched down to the BOX. This etching process also removes pad nitride and monocrystalline silicon if not masked, leaving a single transistor structure, as shown, for each active area mask. However, as alluded to above, with appropriate spacing of pad nitride deposits transistor can be formed under each pad nitride deposit. The active area masks would thus only allow separating of the gate polysilicon between transistors. Even this separation of transistors may be eliminated in some applications in arrays where the gates form bit lines or word lines.

Then, silicide (preferably tungsten silicide, $WSi^x$) is deposited preferably by chemical vapor deposition (CVD) and etched to form sidewall spacers 30 in a self-aligned manner familiar to those skilled in the art. It may be necessary to deposit a thin polysilicon film prior to silicide deposition to improve the adhesion of the $WSi_x$ to the underlying silicon. It may be preferred to deposit a thin polysilicon film or other barrier film prior to silicide deposition to avoid attacking the thin silicon regions. Note that if a barrier such as Tin or WN is used, $WSi_x$ may be replaced by a metal such as tungsten.

Alternatively, as illustrated in FIG. 3B, the disposable active area hard mask is applied and patterned and etching to the BOX is performed as before. Then the hard mask is stripped and a conformal layer of polysilicon and silicide (e.g. $WSi_x$ or silicides of cobalt or titanium) is deposited, again by chemical vapor deposition. (In addition, the suicides may be replaced by a combination of tungsten and barrier tungsten nitride, tantalum nitride, tantalum silicon nitride or any other known, low-resistance material. Additional mask material such as boron or Arsenic doped glass (BSG or ASG) or Ozone TEOS is applied and etched to form sidewalls 32. The silicide (and underlying polysilicon is then etched to the buried oxide and all remaining mask material is stripped. This process thus provides the preferred liner shape 34 of the silicide Referring now to FIG. 4, narrow rectangular masks are applied to allow etching of the silicide and gate conductor near the source and drain. The etch must be selective to nitride and oxide so that the silicon regions are not attacked and the gate conductor and silicide layers are fully removed, stopping on the gate dielectric. Since silicide is conductive and forms the gate contact, an insulating region must be formed adjacent to the source and drain regions. This etch also has the effect of increasing the separation distance between the source and gate and drain and gate by recessing the gate at location 40, hence reducing gate capacitance to the source and drain. The remaining silicide on the masked opposite sides of the source and drain (e.g. at 42) has the beneficial effect of reducing resistance of the source and drain structures and is allowed to remain. Similarly the silicide spacers of the gate region reduce the gate resistance and are a preferred material for forming contacts thereto.

As shown in FIG. 5, the transistor is substantially completed (but for upper level metallization) by standard shallow trench isolation (STI) processing in which the trenches which now exist between transistors are filled with a dielectric such as oxide or nitride or a combination thereof The STI material can then be planarized preparatory to contact formation.

Connections may then be made, as desired, to the source, drain and gate regions, preferably at locations of remaining silicide by lithographically defining and etching openings in the STI material at appropriate locations and depositing metal in the openings and on the surface as shown at 50 of FIG. 5. Alternatively, a damascene gate may be used to contact the gate polysilicon (of either gate electrode or both gate electrodes may be connected together by removing the silicon nitride and replacing it with a conductor) or contacts may be landed in the STI structure to contact the $WSi_x$ liner (FIG. 3B) to make a connection to the gate liner shape as can be appreciated from the illustration of connection 50 in FIG. 5. Damascene and conventional contacts may be used in any combination. The structure also permits different potentials to be applied to either of the dual gates.

Advantageously, the pad nitride and adjacent STI material can also be etched through a portion of the pad nitride thickness and metal deposited in the same operation to form a damascene connection between the gate polysilicon regions 20 and possibly the silicide regions 34, as well. The liner shape is preferred to the sidewall shape of FIG. 3 largely for the reason that the silicide may be contacted away from the gate polysilicon.

In view of the foregoing, it is seen that the invention provides a high performance dual gate field effect transistor having a sub-lithographic channel width, low gate-junction capacitance and low source-drain and gate resistance. Moreover, the process of fabrication of such a high performance transistor is very simple; facilitating manufacture.

While the invention has been described in terms of a single preferred embodiment, those skilled in the art will recognize that the invention can be practiced with modification within the spirit and scope of the appended claims.

We claim:

1. A method of forming a field effect transistor including steps of depositing regions of pad nitride on a silicon layer, etching said silicon layer to undercut said pad nitride to form a conduction channel between a source region and a drain region, depositing polysilicon where said silicon has been etched, etching through said polysilicon, depositing silicide on remaining polysilicon and silicon, and removing said silicide and polysilicon from sides of said conduction channel near said source and drain regions.

2. A method as recited in claim 1, wherein said steps of depositing said silicide and removing said silicide define and active area of said transistor.

3. A method as recited in claim 2, wherein said step of depositing sulicide includes the further step of depositing a disposable hard mask to define said active area of said transistor.

4. A method as recited in claim 3, wherein said disposable hard mask is borosilicate glass.

5. A method as recited in claim 3, wherein said disposable hard mask is a doped glass.

6. A method as recited in claim 3, wherein said disposable hard mask is an arsenic doped glass.

7. A method as recited in claim 3, wherein said disposable hard mask is a ozone TEOS.

8. A method as recited in claim 3, including the further steps of stripping said disposable hard mask, depositing a conformal layer of polysilicon and silicide, applying a further mask, and etching silicide and polysilicon in accordance with said further mask.

9. A method as recited in claim 8 wherein said silicide of said conformal layer are silicides of tungsten, cobalt or titanium.

* * * * *